United States Patent
Lee et al.

(10) Patent No.: US 9,042,149 B2
(45) Date of Patent: May 26, 2015

(54) VOLATILE MEMORY ACCESS VIA SHARED BITLINES

(71) Applicant: International Business Machines Corporation, Armonk, NY (US)

(72) Inventors: Michael Ju Hyeok Lee, Austin, TX (US); Bao G Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/102,476

(22) Filed: Dec. 10, 2013

(65) Prior Publication Data

US 2014/0098590 A1    Apr. 10, 2014

Related U.S. Application Data

(63) Continuation of application No. 13/312,867, filed on Dec. 6, 2011, now abandoned.

(51) Int. Cl.
| | | |
|---|---|---|
| G11C 11/00 | (2006.01) | |
| G11C 14/00 | (2006.01) | |
| G11C 7/18 | (2006.01) | |
| G11C 11/419 | (2006.01) | |

(52) U.S. Cl.
CPC ............. *G11C 14/0054* (2013.01); *G11C 7/18* (2013.01); *G11C 11/419* (2013.01)

(58) Field of Classification Search
CPC ... G11C 11/412; G11C 11/413; G11C 11/419
USPC .............................................. 365/154, 51, 63
See application file for complete search history.

(56) References Cited

U.S. PATENT DOCUMENTS

| | | | |
|---|---|---|---|
| 5,265,047 | A | 11/1993 | Leung et al. |
| 5,274,746 | A | 12/1993 | Mashiko |
| 5,815,432 | A | 9/1998 | Naffziger et al. |
| 6,046,923 | A | 4/2000 | Evans |
| 6,198,656 | B1 | 3/2001 | Zhang |
| 6,473,356 | B1 | 10/2002 | Raszka |
| 6,549,453 | B2 * | 4/2003 | Wong ............................ 365/156 |
| 6,711,051 | B1 | 3/2004 | Poplevine |
| 6,876,595 | B2 | 4/2005 | Bhavnagarwala |
| 6,880,144 | B2 | 4/2005 | Kumala |
| 7,088,627 | B1 | 8/2006 | Bajwa |
| 7,092,279 | B1 | 8/2006 | Sheppard |
| 7,099,202 | B1 | 8/2006 | Son |
| 7,215,563 | B2 | 5/2007 | Brandon |

(Continued)

OTHER PUBLICATIONS

Anonymous—"Array Bitline Precharge Power-Saving Technique", iP.com PriorArtDatabase, pp. 1-2 (Mar. 22, 2010).

(Continued)

*Primary Examiner* — Son Dinh
(74) *Attorney, Agent, or Firm* — Parashos Kalaitzis; Mark P Kahler (57) ABSTRACT

A memory includes an array of memory cells that form rows and columns. The rows of the array include memory cell pairs. The memory cells may include two cross-coupled inverters and two pass-devices that couple to alternate sides of the cross-coupled inverters. The two memory cells of a memory cell pair share a common intra-pair bitline. Adjacent memory cell pairs share a common inter-pair bitline. To perform a data read operation on a particular memory cell in a memory cell pair in the rows and columns of the array, wordline drive circuitry transmits wordline activate signals to select both the row for the data read operation and a particular one of the pair of memory cells for the data read operation.

20 Claims, 9 Drawing Sheets

(56) References Cited

U.S. PATENT DOCUMENTS

| | | | |
|---|---|---|---|
| 7,286,383 B1 | 10/2007 | Poplevine | |
| 7,570,532 B1* | 8/2009 | Lloyd | 365/210.14 |
| 7,738,283 B2 | 6/2010 | Wong | |
| 7,813,163 B2 | 10/2010 | Pille | |
| 2009/0303776 A1 | 12/2009 | Mair | |

OTHER PUBLICATIONS

Buettner—"Concept for Minimized Data-in-Access in Random Access Memory with Write-Through Function", iP.com PriorArtDatabase, pp. 53-56 (Mar. 31, 2005).

Ditlow—"Minimizing Power in High Performance PLAs", iP.com PriorArtDatabase, pp. 1-5 (Jan. 29, 2005).

Hades—"CMOS Six-transistor SRAM Storage Cell", pp. 1-2, downloaded from http://tams-www.informatik.uni-hamburg.de/applets/hades/webdemos/05-switched/40-cmos/sramcell.html on Oct. 27, 2011.

Harris—"Introduction to CMOS VLSI Design, Lecture 13: SRAM", Harvey Mudd College, pp. 1-38 (Spring 2004).

Hwang—"Folded Bitline Configuration"; IBM TDB, pp. 1-2 (Aug. 1, 1987).

* cited by examiner

READ COL B

FIG. 3A

READ COL A

FIG. 8B
WRITE MEMORY

FIG. 8A
READ MEMORY

FIG. 9

VOLATILE MEMORY ACCESS VIA SHARED BITLINES

CROSS REFERENCE TO RELATED PATENT APPLICATIONS

This patent application is a continuation of, and claims priority to, the U.S. Patent Application entitled "VOLATILE MEMORY ACCESS VIA SHARED BITLINES", inventors Michael Ju Hyeok Lee, et al., application Ser. No. 13/312,867, filed Dec. 6, 2011, that is assigned to the same Assignee as the subject patent application, the disclosure of which is incorporated herein by reference in its entirety.

This patent application relates to the U.S. Patent Application entitled "Single-Ended Volatile Memory Access", inventors Michael Ju Hyeok Lee, et al., application Ser. No. 13/312,945, filed Dec. 6, 2011, that is assigned to the same Assignee as the subject patent application, the disclosure of which is incorporated herein by reference in its entirety.

BACKGROUND

The disclosures herein relate generally to volatile memory, and more specifically, to writing information to and reading information from static random access memory (SRAM). Writing to and reading information from SRAM expends valuable energy. Reduction of such energy expenditures by SRAM is desirable. One use of SRAM is in an information handling system (IHS) to store information in an SRAM array.

BRIEF SUMMARY

In one embodiment, a method is disclosed that includes configuring a plurality of memory cells in rows and columns, wherein a first pair of memory cells is situated in a first row of the memory array. The first pair of memory cells includes first and second memory cells that couple to a first intra-pair bitline between the first and second cells to share the first intra-pair bitline. The first and second memory cells also couple to first and second opposed inter-pair bitlines, respectively. The method also includes sharing the first intra-pair bitline for writing and reading operations of the first pair of memory cells. The method further includes sharing the first opposed inter-pair bitline with a second pair of memory cells adjacent the first pair of memory cells in the first row for writing and reading operations of the first pair of memory cells and the second pair of memory cells. The method still further includes sharing the second opposed inter-pair bitline with a third pair of memory cells adjacent the first pair of memory cells in the first row for writing and reading operations of the first pair of memory cells and the third pair of memory cells.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

In one embodiment, the disclosed memory circuit includes an array of memory cells wherein memory cells in adjacent columns share both complement (bl') and true (bl) bitlines on boundaries between cells to provide energy saving during a read operation. More particularly, the two memory cells of a particular memory cell pair share an intra-cell bitline between the two cells of that pair. Moreover, adjacent pairs of memory cells may share an inter-cell bitline between the pairs of memory cells. A read/write head provides robust differential writing of data to the memory cells of the memory cell pairs, as well as energy efficient reading of memory cell data. Memory cells may be manufactured on integrated circuit wafers. Overlapping memory cells slightly may provide desirably efficient use of wafer area while leaving sufficient space for placing wordline pairs in each row of memory.

Figure 1:
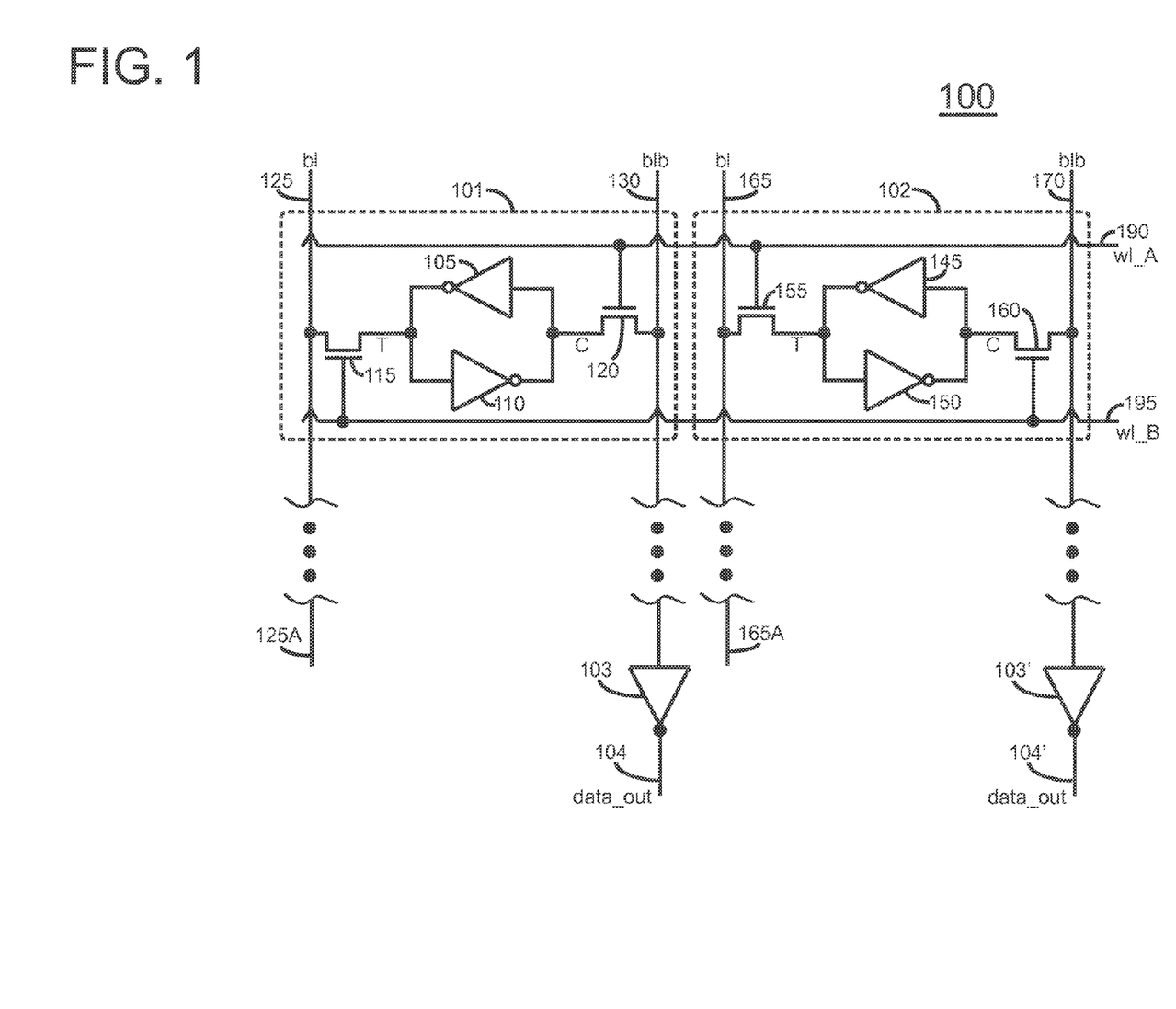
FIG. 1 is a schematic diagram of one embodiment of the disclosed memory circuit including a pair of SRAM memory cells.
Figure 2:
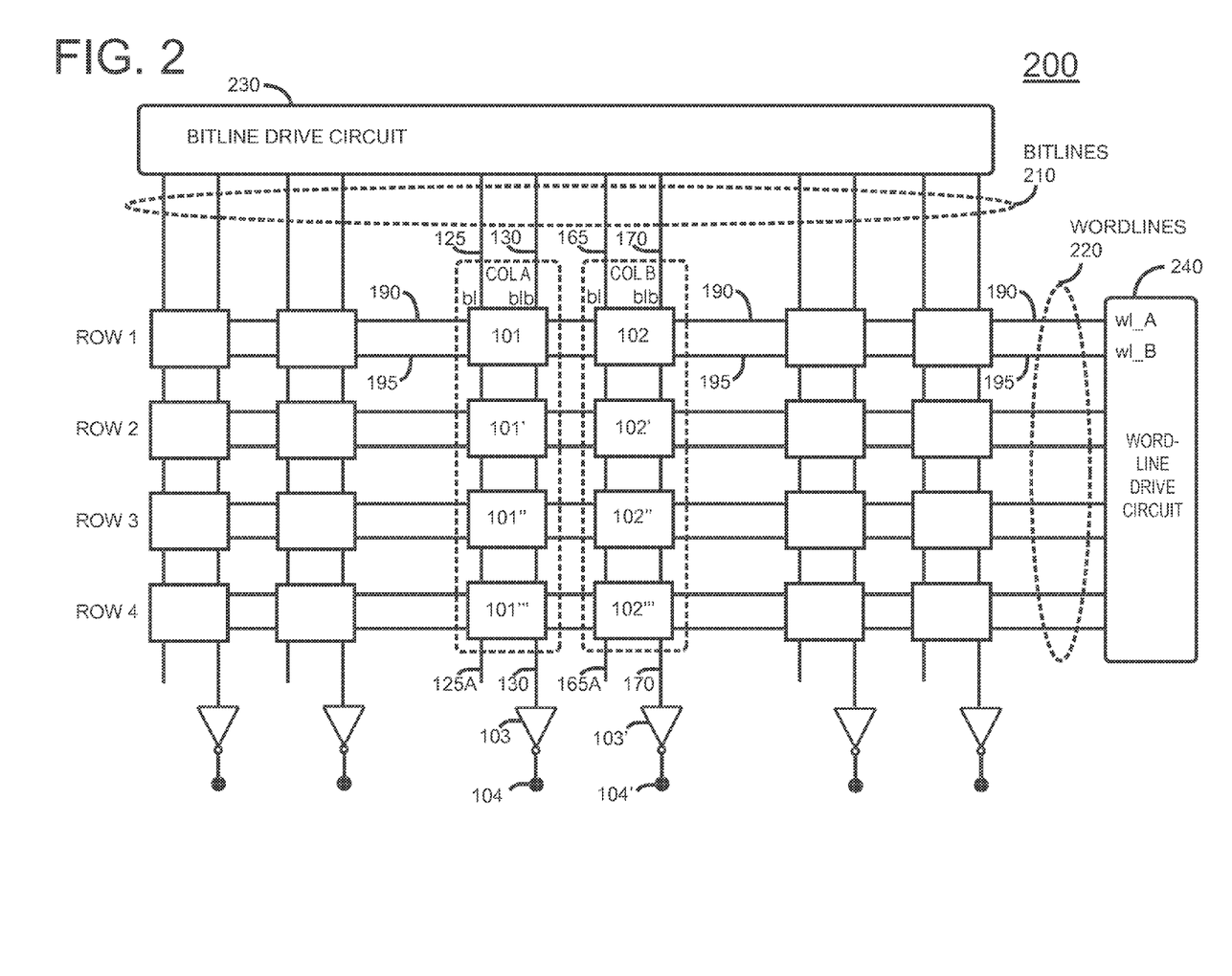
FIG. 2 is a block diagram of one embodiment of the disclosed array of memory cells.

FIG. 1 is a schematic diagram of one embodiment of the disclosed memory circuit 100. In this particular embodiment, memory circuit 100 includes at least static random access memory (SRAM) cells 101 and 102 arranged in at least two columns. For simplicity, FIG. 1 shows only the memory cells 101 and 102 that may form the top-most cells of respective columns in a memory array. Other like memory cells may populate a memory array of columns and rows, such as the memory array that FIG. 2 shows. Memory cell 101 includes a cross-coupled inverter pair 105, 110 for storing a data bit. As seen in FIG. 1, memory cell 101 also includes pass-devices 115 and 120 that couple to inverters 105 and 110 to facilitate the reading and writing of information for that memory cell. Memory cell 102 includes a cross-coupled inverter pair 145, 150 for storing another data bit. Memory cell 102 also includes pass-devices 155 and 160 that couple to inverters 145 and 150 to facilitate the reading and writing of information for that memory cell. Memory cells 101 and 102 may each store a logic value of the cross-coupled inverter pairs 145, 150 and 155, 160 respectively that may be accessed as either a true (T) data bit or a complement (C) bit.

Bitlines bl 125 and blb 130, and also wordlines wl_A 190 and wl_B 195, couple to memory cell 101. The designations "bl" and "blb" indicate that these bitlines are differential bitlines that complement one another. In one embodiment, bitline bl 125 is a true bitline and bitline blb 130 is a complement bitline. In other embodiments, the roles of bitlines 125 and 130 may reverse. Bitlines bl 165 and blb 170, and also wordlines wl_A 190 and wl_B 195, couple to memory cell 102. Bitlines blb 130 and blb 170 couple to the respective downstream output gates 103 and 103'. In one embodiment, data output gates 103 and 103' function as evaluation gates for data content of memory cells 101 and 102. In actual practice, gate 103 and gate 103' may be implemented as two inverters, wherein one inverter couples to bitline 130 and the other inverter couples to bitline 170. Bitlines blb 130 and blb 170 are corresponding bitlines of SRAM memory cells 101 and 102 because they each exhibit the same logic convention in their respective SRAM cells. Data output gate 103 senses bitlines blb 130 and data output gate 103' senses blb 170 in a single-ended read operation of the complement of the logic value that cell 101 or 102 stores depending on which wordline, wl_A 190 or wl_B 195, activates during the read operation. Gate 103 or gate 103' thus acts as an evaluation gate for the data contents of the selected memory cell and outputs the data content of the addressed memory cell on output data_out 104 or data_out 104' respectively in one embodiment.

More particularly, the output data bit at data_out 104 corresponds to the stored bit in memory cell 101 when the wordline wl_A 190 activates for a single-ended read operation. Alternatively, the output data bit at data_out 104' corresponds to the stored bit in memory cell 102 when wordline wl_B 195 activates for a single-ended read operation. Bitline drive circuit (230 in FIG. 2) couples to bitlines bl 125 and blb 130, or to bl 165 and blb 170 to select a particular one of memory cells 101 and 102, i.e. a particular column, for a write operation. Wordline drive circuit (240 in FIG. 2) couples to wordlines wl_A 190 and wl_B 195 to select a particular row of a memory array that multiple rows and columns of memory cells 101 and 102 may form.

To store a data bit in memory cell 101 during a differential write operation, wordline drive circuit (240 in FIG. 2) selects and activates both wordlines wl_A 190 and wl_B 195. Returning to FIG. 1, this action effectively connects pass-device 115 to bitline bl 125 and also connects pass device 120 to bitline blb 130. Differentially activating bitlines bl 125 and blb 130 in this manner writes a data bit into memory cell 101 by forcing the inverter pair 105, 110 to assume a state corresponding to the state of bitlines 125 and 130. In this differential write operation to memory cell 101, bitline drive circuit (230 in FIG. 2) forces the desired logic state onto bitline 125 while also forcing the complement of the desired logic value onto bitline 130. For write operations to memory cell 101, the bitline drive circuit (230 in FIG. 2) need not drive bitlines bl 165 and blb 170 that associate with memory cell 102.

When wordline drive circuit (240 in FIG. 2) activates both wordlines wl_A 190 and wl_B 195 to write information to memory cell 101, this action also activates pass devices 155 and 160 of memory cell 102. However, this action does not affect the contents of memory cell 102 because bitline drive circuitry (not shown) does not activate bitlines blb 165 and blb 170 when performing a write operation to memory cell 101.

Memory cell arrays may include a single row or multiple rows with multiple columns. The particular aspect ratio of the rows and columns may depend on the application for the memory cell array and other considerations such as the energy needed to pre-charge bitlines and timing considerations. At least two columns of memory cells form the exemplary embodiment of the disclosed memory circuit.

FIG. 2 shows the disclosed memory array 200 of memory cells 101, 102 arranged in columns and rows. The columns are arranged in pairs of cells according to the teachings of FIG. 1 with representative memory cell pairs 101,102 being identified in particular in row 1. This particular embodiment includes four (4) rows of cells, namely rows 1, 2, 3 and 4. Other embodiments may include a larger or smaller number of rows of cells depending on the particular application. For example, eight or sixteen columns may be included in the memory array to accommodate bytes of data. Similarly, nine or eighteen columns may be included in the memory array to accommodate bytes of data with a parity check bit. While memory array 200 may include fewer or more columns than the six (6) representative columns that FIG. 2 shows, for discussion purposes FIG. 2 identifies the two center columns of array 200 as column A (COL A) and column B (COL B). Memory array 200 may include more columns than the center columns identified as column A and column B. FIG. 2 uses prime designators to differentiate the memory cell pairs 101, 102 in the different rows of memory array 200. For example, row 1 includes memory cells 101, 102 in COL A and COL B, respectively. Row 2 includes memory cells 101', 102' in COL A and COL B, respectively. Row 3 includes memory cells 101", 102" in COL A and COL B, respectively. Row 4 includes memory cells 101''', 102''' in COL A and COL B, respectively.

In memory array 200 of FIG. 2, bitlines bl 125 and blb 130 of COL A extend vertically through each of memory cells 101, 101', 101" and 101'''. Bitline blb 130 of COL A also couples to the input of gate 103. In memory array 200, bitlines bl 165 and blb 170 of COL B extend vertically through each of memory cells 102, 102', 102" and 102'''. Bitline blb 170 of COL B also couples to the input of gate 103'. Bitlines bl 125 and 165 extend vertically through each of the memory cells in COL A and COL B, and terminate in ends 125A and 165A as also shown in FIG. 1. In one embodiment, the terminations at ends 125A and 165A may be open circuits.

Returning to FIG. 2, the following example describes a write operation to one of memory cells 101, 102 in ROW 1 of memory array 200, namely the particular memory cells 101, 102 in COL A and COL B, respectively. In general, differential bitline drive circuit 230 selects the appropriate bitlines to designate a particular column for differential write operations to a memory cell in memory array 200. Wordline drive circuit 240 further selects a particular row of memory array 200 by activating appropriate wordlines 220 corresponding to that row. In particular, the differential pair of bitlines 125 and 130 along with wordlines wl_A 190 and wl_B 195 in row 1 uniquely select memory cell 101 of COL A for data bit storage. Alternatively, the differential pair of bitlines 165 and 170 along with wordlines wl_A 190 and wl_B 195 of row 1 may uniquely select memory cell 102 of COL B for data bit storage.

In one embodiment, bitline drive circuit 230 precharges all of the bitlines 210 to the supply voltage (not specifically shown) when memory array 200 is in the quiescent or inactive state. The pre-charge voltage level corresponds to a logic 1. A memory that needlessly causes a memory cell bitline to discharge carries a penalty in wasted energy in the memory array. The disclosed memory array 200 may avoid wasting energy by arranging memory cells in pairs, as exemplified by memory cell pair 101 and 102 of FIGS. 1 and 2. In one embodiment, wordline drive circuit 240 activates only wordline wl_A 190 of row 1 to read the contents of memory cell 101 of COL A in row 1. Bitline 130 then reflects the state of memory cell 101. Bitline 125 associated with memory cell 101 of COL A, and bitlines 165 and 170 associated memory cell 102 of COL B, may remain in the pre-charged state and hence do not waste energy. Leaving the bitlines in the pre-charged state may conserve energy.

Gate 103 or gate 103' senses the state of memory cell 101 or memory cell 102 respectively by passing the data bit from the selected memory cell to the data output line data_out 104 or 104' via either bitline 130 or 170. The output data reflects the state of the memory cell uniquely appearing on one bitlines 130 or 170, and addressed on one corresponding wordlines wl_A 190 or wl_B 195. The non-selected bitline remains at logic level 1. More specifically, gate 103 and 103' couple to input bitlines 130 and 170 respectively. When wordline wl_A 190 activates pass gate 120 of memory cell 101, the complement of the logic state of memory cell 101 appears on bitline 130, while bitline 170 remains in a pre-charged logical 1 state. Alternatively, when wordline wl_B 195 activates pass gate 160, the complement of the state of memory cell 102 appears on bitline 170 while bitline 130 remains in a pre-charged logical 1 state.

TABLE 1 shows the logic states or "truth table" of gate 103 when gate 103 is an inverter.

TABLE 1

| bitline 130 | bitline 170 | data output 104 |
|---|---|---|
| 0 | 1 | 1 |
| 1 | 1 | 0 |

In reading the contents of memory cell 101 of row 1, bitline 170 is in its pre-charged state (logical 1), which corresponds to the TABLE 1 entries having a logic 1 in the bitline 170 column. Wordline wl_A 190 activates pass device 120 which reflects the complement of the memory contents of memory cell 101 to bitline 130. If the memory cell contains a logic 1, then the complement 0 appears on bitline 130. From TABLE 1, a logic level 1 then appears at the data output data_out 104. Similarly, if memory cell 101 contained a logic level 0, then the complement logic value 1 appears on bitline 130, which results in a logic level 0 appearing at the data output data_out 104.

In a similar manner, to read the contents of memory cell 102, the data bit stored in memory cell 102 reflects in the data output data_out '104 when wordline wl_B 195 activates pass device 160 of memory cell 102. In this case, bitline blb 130 stays at a logic 1 level. Memory cell 102 content of logic level 1 appears as the complement 0 on bitline blb 170 which appears as a logic level 1 at data output data_out' 104. Similarly, memory cell 102 content of logic level 0 appears as the complement 1 on bitline blb 170 which appears as a logic level 0 at data output data_out 104.

In one embodiment, since one of the two wordlines wl_A 190 and wl_B 195 uniquely activates only one of the single-ended bitlines blb 130 and blb 170 of the pair of memory cells 101, 102, this action effectively uniquely addresses one of memory cells 101, 102 in the addressed row. This approach may avoid the use of multiplexer circuitry otherwise needed to distinguish which bitline is addressed in other methods of reading cells. Thus, the disclosed memory array 200 may reduce the discharge of energy on unneeded bitlines. In this embodiment, gates 103 and 103' act as evaluation gates that senses respective single-ended read bitlines of a pair of cells, and pass the data from the memory cell selected by the wordline. In a preferred embodiment, gate 103 is a inverter gate.

Exemplary memory cells 101 and 102 each include a true memory bitline bl and a complement memory bitline blb. Although the read operation of one embodiment operates on complement memory bit lines, a memory read operation may be configured to sense the true bitlines with substantially equal results to the scenario wherein a memory read operation senses the complement bit lines blb. Sensing true bitlines produces the complement of the memory cell logic state at the data output.

In summary, for one embodiment of the disclosed methodology, Table 2 below shows the state changes of the bitlines of SRAM cells 101 and 102 in row 1 of memory array 200 when wordline drive circuit 240 addresses one of cells 101 and 102. Bitline state changes consume energy. The disclosed methodology may reduce bitline state changes. For discussion purposes, assume that wordline circuit 240 addresses memory cell 101 to read the data contents of that SRAM cell. In this scenario, memory cell 101 is the addressed cell and SRAM cell 102 is the unaddressed cell of an memory cell pair.

TABLE 2

| Addressed memory cell | |
|---|---|
| bl | remains in precharge state (no state change) |
| blb | may change state according to the memory contents of the memory cell (may expend energy) |
| Unaddressed memory cell | |
| bl | may change state, state change does not propagate beyond this cell |
| blb | remains in precharge state (no state change) |

When wordline circuit 240 addresses memory cell 101 for a read operation by activating the blb bitline 130 of memory cell 101, the blb bitline 130 of addressed SRAM cell 101 may change state depending on the memory content of the memory cell and drives evaluation gate 103. This state change on the blb bitline of addressed SRAM cell 101 and also the possible state change on the bl line of the unaddressed SRAM cell 102 may consume energy. However, in one embodiment, by virtue of the effective termination of bitline 165 at 165A for read operations (FIG. 1 and FIG. 2), when memory cell 101 is the addressed memory cell, a state change occurring on the bitline bl 165 of the unaddressed memory cell 102 does not propagate further downstream beyond termination 165A to circuitry that might otherwise load down the bitline bl 165 and consume more energy. In this manner, the memory circuit may conserve energy during a read operation by avoiding the need for bitline bl 165 to drive logic gates downstream of termination 165A in the column (e.g. COL B) that includes the unaddressed memory cell 102. The remaining bitline bl of addressed SRAM cell 101 and the bitline blb of unaddressed memory cell 102 remain in the precharge state, thus conserving energy during a read operation. Whereas bitline bl 165 of memory cell 102 includes an effective termination for read operations at 165A, bitline bl 125 of memory cell 101 includes an effective termination for read operations at 125A. In one embodiment, these terminations are effective terminations with respect to read operations and do not affect write operations. The teachings above apply in a similar manner when memory cells 101 and 102 reverse roles such that memory cell 102 is the addressed memory cell and memory cell 101 is the unaddressed memory cell. In that case, when memory cell 102 becomes the addressed memory cell and memory cell 101 is the unaddressed memory cell, then termination 125A prevents the propagation of data signals further downstream beyond termination 125A to circuitry that might otherwise load down bitline bl 125 and consume more energy.

Figure 3A:
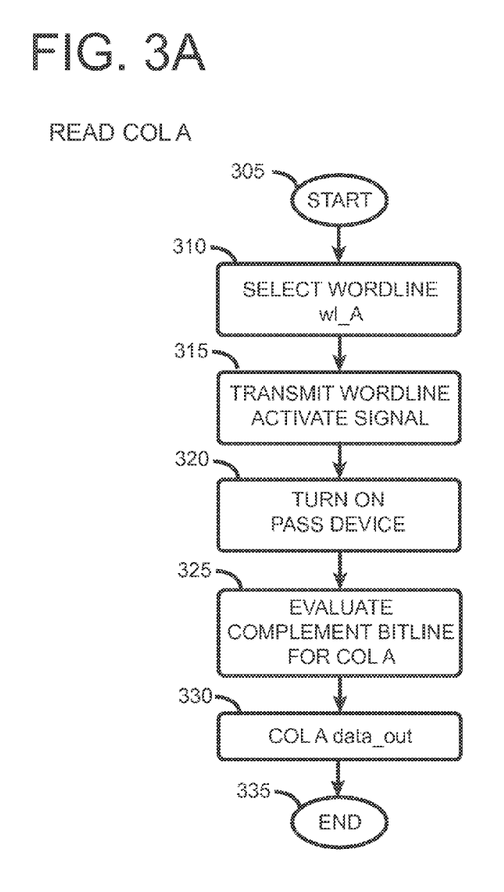
FIG. 3A is a flow chart that depicts one method for reading the contents of a memory cell.

FIG. 3A is a flow chart describing one embodiment of the disclosed method of reading from a column A (COL A) of the SRAM memory cells 101 and 102. Process flow commences at start block 305. Wordline drive circuit 240 selects wordline wl_A, as per block 310. More particularly, wordline drive circuit 240 transmits the wordline activate signal to the column A memory cell, as per block 315. The wordline activate signal turns on pass devices (120 and 155 in FIG. 1), as per block 320. In response, the complement of the data bit stored in memory cell 101 appears on the complement bit line blb 130. The evaluation gates 103, such as inverters in one embodiment, evaluate the complement operation of bitline blb 130 of COL A, as per block 325. Evaluation gate 103 outputs a bit corresponding to the data bit stored in column A memory cell 101 at data_out 104, as per block 330. Process flow ends at end block 335 or restarts at start block 305 to read another memory cell.

Figure 3B:
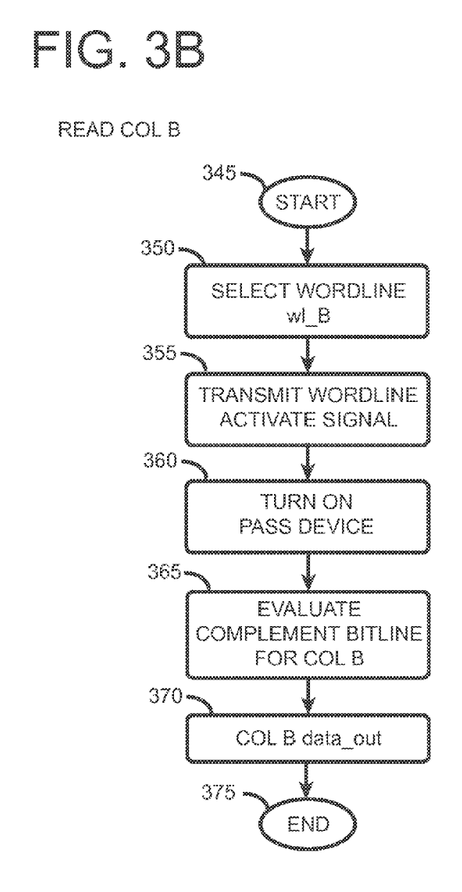
FIG. 3B is a flow chart that depicts one method for reading the contents of another memory cell.

FIG. 3B is a flow chart describing one embodiment of the disclosed method of reading from a column B (COL B) of the SRAM memory cells 101 and 102. Process flow commences at start block 345. Wordline drive circuit 240 selects wordline wl_B, as per block 350. More particularly, wordline drive circuit 240 transmits the wordline activate signal to the column B memory cell, as per block 355. The wordline activate signal turns on pass devices (115 and 160 in FIG. 1), as per block 360. In response, the complement of the data bit stored in memory cell 101 appears on the complement bit line blb 170. The evaluation gate 103' (inverter) evaluates the complement of bitline blb 130 of COL B, as per block 365. Evaluation gate 103' outputs a bit corresponding to the data bit stored in column B memory cell 102 at data_out 104', as per block 370. Process flow ends at end block 375 or restarts at start block 345 to read another memory cell.

In summary, the choice of activating either wordline wl_A or wordline wl_B selects which one of memory cells of column A or column B respectively outputs data to its respective complement bitline blb. The evaluation gates processes complement the respective bitlines blb, evaluating and outputting the data from the selected memory cell to the respective data_out line.

Figure 4:
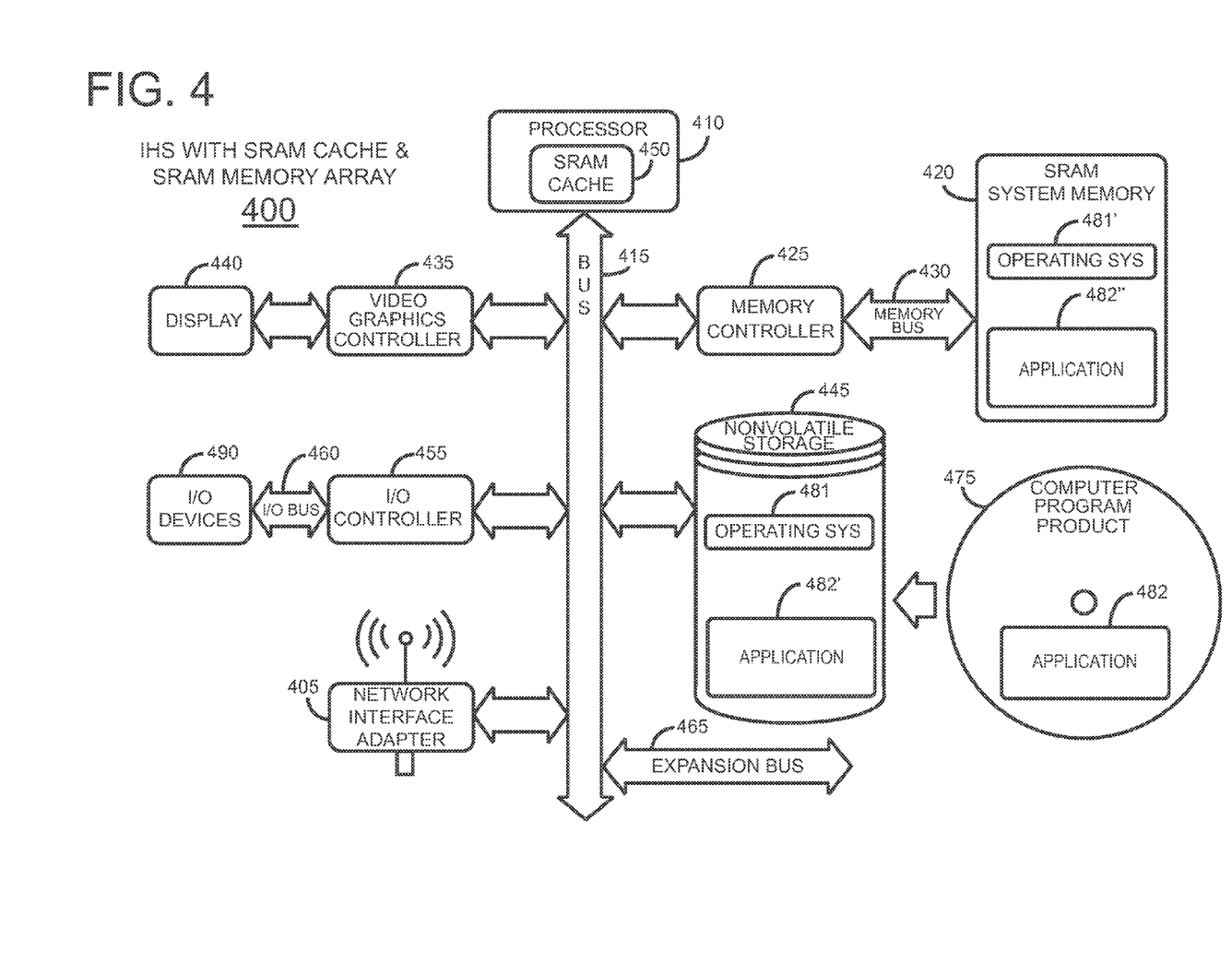
FIG. 4 is an information handling system (IHS) that includes the disclosed array of memory cells.

FIG. 4 shows an information handling system (IHS) 400 that is configured to employ the disclosed SRAM memory circuit technology and is described in more detail below.

Figure 5:
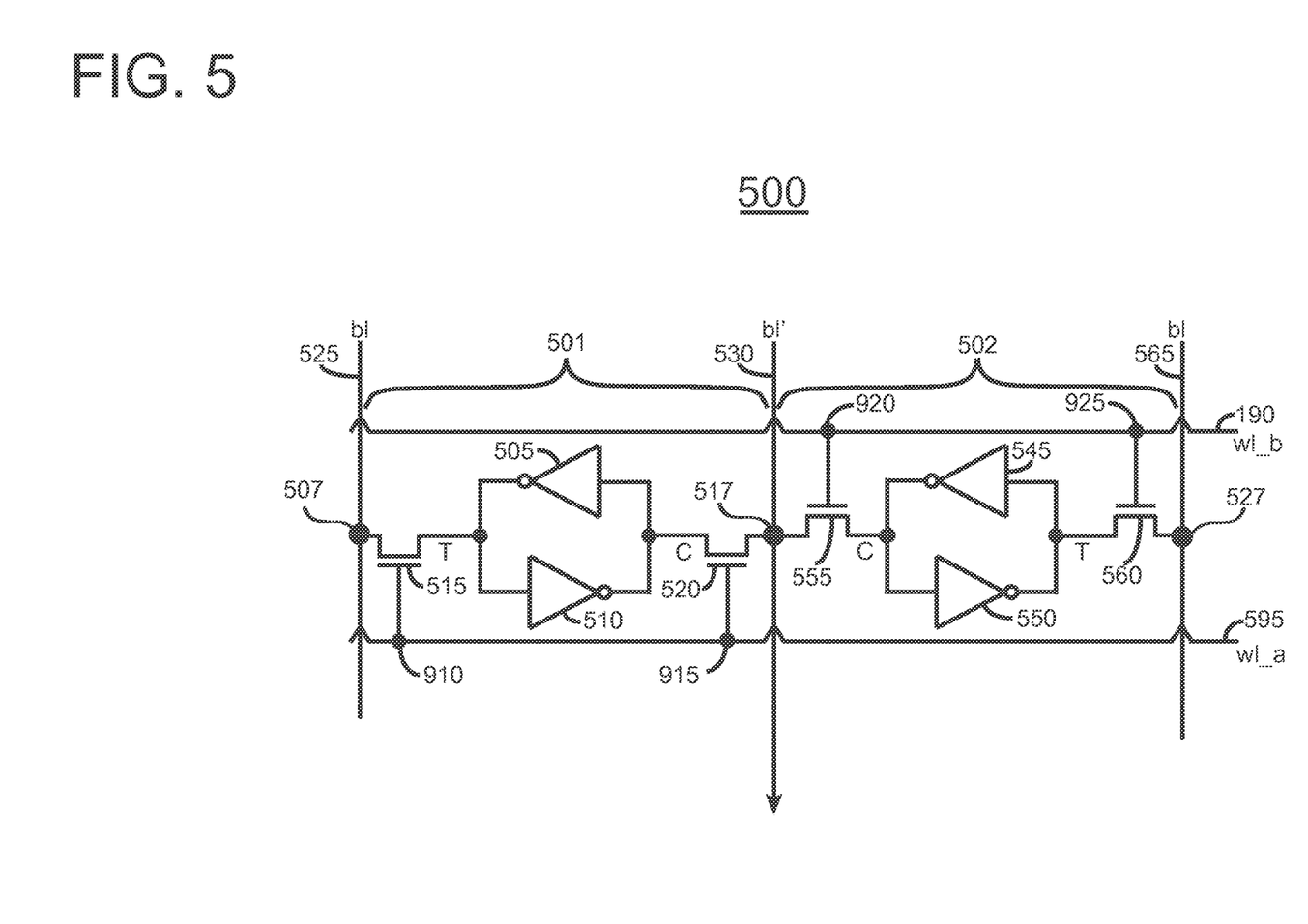
FIG. 5 is a schematic diagram of another embodiment of the disclosed memory circuit including a pair of SRAM memory cells.

FIG. 5 shows another embodiment of the disclosed memory circuit as memory circuit 500. Memory circuitry 500 includes of a pair of SRAM memory cells 501 and 502 that operate in an energy efficient manner. SRAM memory cells 501 and 502 are arranged in at least two columns of which FIG. 5 depicts the two top-most cells. Memory cell 501 includes a cross-coupled inverter pair 505 and 510, and pass devices 515 and 520. Memory cell 501 couples to bitlines bl 525 and bl' 530, and to wordline wl_a 595, via pass devices 515 and 520 as shown. Memory cell 502 includes cross-coupled inverter pair 545 and 550, and pass devices 555 and 560. Memory cell 502 couples to bitlines bl' 530 and bl 565, and to wordline wl_b 590, via pass devices 555 and 560 as shown. SRAM memory cells 501 and 502 share bitline bl' 530 as discussed in more detail below. Pass devices 515 and 520 couple to wordline wl_a 595 at nodes 910 and 915, respectively. Pass devices 555 and 560 couple to wordline wl_b 590 at nodes 920 and 925, respectively.

Figure 6:
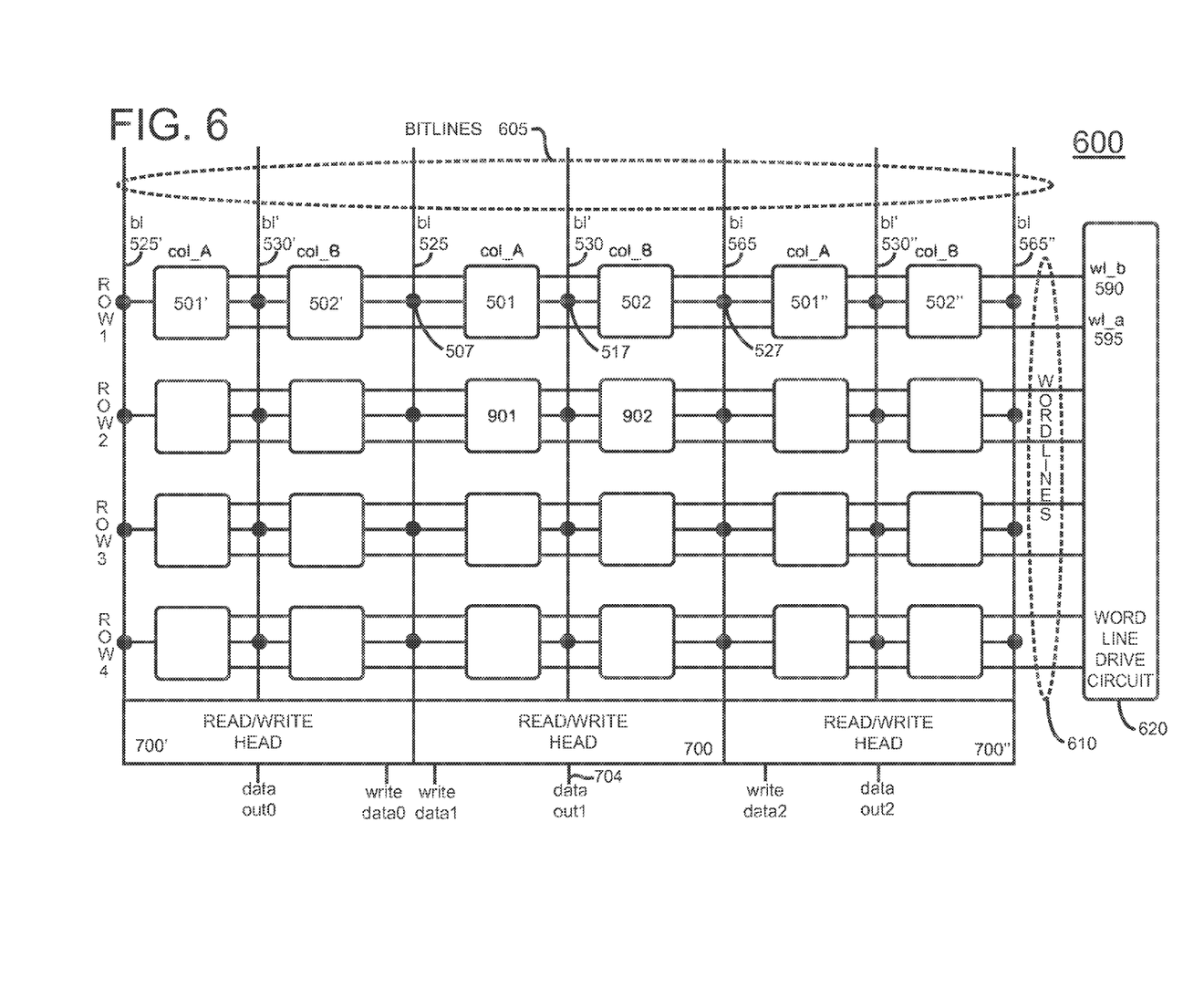
FIG. 6 is a block diagram of another embodiment of the disclosed array of memory cells.

FIG. 6 shows a memory array 600 including SRAM memory cells 501 and 502 embedded in the array. Memory array 600 arranges the SRAM memory cells in columns and rows as shown. In FIG. 6, bitlines are shown generally as bitlines 605 and wordlines are shown generally as wordlines 610, although specific bitlines and specific wordlines will have other numbers. Memory array 600 further includes read/write heads 700, 700' and 700". Memory cells 501 and 502 share bitline bl' 530 at node 517. Moreover, memory cell 501 shares bitline bl 525 with adjacent memory cell 502' at node 507, while memory cell 502 shares bitline bl 565 with adjacent memory cell 501" at node 527. In general, in memory array 600, columns of memory cells share a common bitline located between the cell columns.

Returning now to FIG. 5, activating wordline wl_a 595 during a single-ended read operation causes the complement of the data contents of memory cell 501 to appear on bitline bl' 530. Similarly, activating wordline wl_b 590 causes the complement of the data contents of memory cell 502 to appear on bitline bl' 530. Data contents of either memory cell 501 or 502 appear on the same bitline bl' 530, thus providing sharing of this bitline bl' 530. Activation of wordline wl_a 595 or wl_b 590 uniquely selects either SRAM memory cell 501 or 502, respectively, to place its data on shared bitline bl' 530. As will be described below, bitlines bl 525 and bl 565 remain at the pre-charge logic level 1 during read operations even though pass devices 515 or 560 may be active. Thus, bitlines bl 525 and bl 565 do not needlessly discharge and waste energy during read operations of cells 501 and 502.

During a differential write operation to memory cell 501 of SRAM cell pair 501, 502, wordline wl_a 595 activates pass devices 515 and 520 via nodes 910 and 915, respectively. More particularly, a read/write head 700 (discussed below with reference to FIG. 7) acts as a driver that forces a desired data bit onto bitline bl 525 and simultaneously forces the complement of the data bit value onto bitline bl' 530 to write the data bit value to memory cell 501. Similarly, when selecting wordline wl_b 590 for a differential write operation to memory cell 502 of SRAM cell pair 501, 502, read/write head 700 forces a desired data bit value onto bitline bl 565 and forces the complement of that data bit value onto the shared bitline bl' 530. Bitlines bl 525 and 565 form an opposed pair of intra-cell bitlines in that they are on opposites sides of a cell pair. Intra-cell bitlines may be shared by adjacent columns within memory cell pairs.

Figure 7:
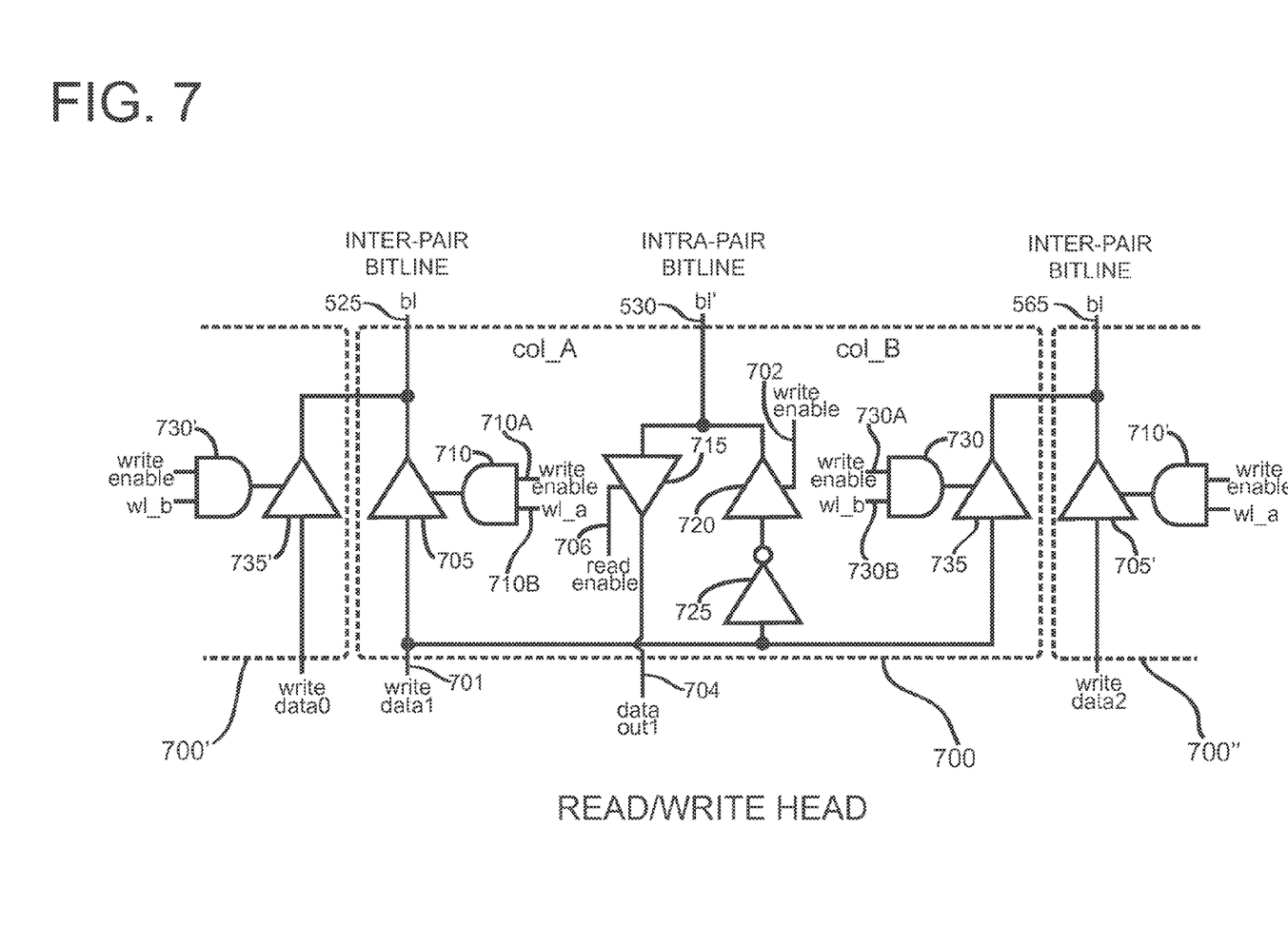
FIG. 7 is a schematic diagram of a read/write head used included in the disclosed memory array.

FIG. 7 shows a representative read/write head 700 configured to perform single-ended reading of, and robust differential writing to, a selected memory cell in memory array 600. Read/write head 700 couples to bitlines bl 525, bl' 530, and bl 565 to drive data onto, and to receive data from, those bitlines during write and read operations, respectively. As shown in FIG. 7, read/write head 700 shares bitline bl 525 with the partially shown read/write head 700' to its left (i.e. read/write head 700' in FIG. 6). Returning to FIG. 7, read/write head 700' includes gate 730' further including write enable and wl_b enable inputs, which may enable driver 735 to drive data0 data to inter-pair bitline bl 525 during a write data operation to a column B col_B memory cell exemplified by memory cell 502'. Read/write head 700 also shares bitline bl 565 with the partially shown read/write head to its right (read/write head 701" in FIG. 6). Read/write head 700" includes gate 710' further including write enable and wl_a enable inputs, which may enable driver 705 to drive data2 data to inter-pair bitline bl 565 during a write data operation to a column A col_A memory cell exemplified by memory cell 501".

During a differential write operation to memory cell 501 of an SRAM memory cell pair 501 and 502, addressing circuitry (not shown) transmits an enable signal on write enable input 710A of AND gate 710 to enable driver 705, while input 702 enables driver 720. For this write operation to memory cell 501 to proceed, the addressing circuitry (not shown) also transmits an enable signal to the remaining input 710B of gate 710 (and also to wordline wl_a 595), thus enabling gate 710. Driver 705 sends a data bit on input 701 to bitline bl 525. Simultaneously, the inverter 725 complements (inverts) the data bit and drives the complement of the data bit through the write enabled driver 720 onto bitline bl' 530 for a robust write operation to memory cell 501 through the enabled pass devices 515 and 520.

For a differential write operation to memory cell 502 of FIG. 5, addressing circuitry (not shown) signals wordline wl_b 590 to enable memory cell 502 and also enable gate 730 on input 730B of FIG. 7. More specifically, a driver 735 sends a data bit from input 701 to bitline bl 565 through driver 735. Simultaneously, the inverter 725 complements (inverts) the data bit and drives the complement of the data bit onto bitline bl' 530 through driver 720 for a robust write operation to memory cell 502 through the enabled pass devices 555 and 560. From the discussion above, it can be seen that read/write head 700 differentially writes to SRAM memory cell 501 via bitlines 525 and 530, whereas read/write head 700 differentially writes to SRAM memory cell 502 via bitlines 530 and 565. Bitline 530 is a shared bitline because memory circuit 500 employs this bitline for both write operations to memory cell 501 and write operations to memory cell 502 via the common node 517. Since shared bitline 530 is between memory cells 501 and 502 of a particular memory cell pair, bitline 530 is an "intra-pair" shared bitline for that memory cell pair.

During a singled-ended read operation, the wordline wl_a 595 or wl_b 590 activates pass device 520 or pass device 555, respectively of FIG. 5. Output data driver 715 of read/write head 700 of FIG. 7 is also enabled with read enable input 706. The complement of the data contents of the selected memory cell reflects to the common shared bitline bl' 530 and transmits through driver 715 to data output 704. In this embodiment bitline bl' 530 reflects the complement of the data stored in the enabled memory cell, so output data driver may be configured as an inverter, so that data output 704 reflects the contents of the memory cell rather than the complement of the content of the memory cell.

Returning to FIG. 6, the disclosed memory circuit topology includes two different types of bitline sharing, exemplified by intra-pair bitlines 530', 530, and 530" and by inter-pair bitlines 525 and 565. As discussed above, using memory cell pair 501, 502 in row 1 as a representative memory cell pair, FIG. 6 shows that within the memory cell pair 501, 502 the two memory cells share a common "intra-pair" bitline bl' 530 and share a common node 517 for differential memory write operations to either of cells 501 and 502. Likewise, in row 2 the memory cell pairs 901 and 902 below memory cell pair 501, 502 also couple to the intra-pair shared bitline bl' 530. In this particular embodiment, intra-pair shared bitline 530 is a bl' bitline that passes through and couples to all of the cell pairs in the cell pair column of which memory cell pair 501, 502 are the uppermost cells. Intra-pair bitline bl' 530 couples as well to read/write head 700, as FIG. 7 depicts. Memory array 600 also uses intra-pair bitline bl' 530 for single-ended read operations.

Returning again to FIG. 6, the disclosed memory circuit topology also employs "inter-pair" bitline sharing that is a type of bitline sharing different from the "intra-pair" bitline sharing discussed above. Whereas "intra-pair" bitline sharing refers to sharing of a bitline by two cells within a cell pair in a particular row, "inter-pair" bitline sharing refers to sharing of a bitline between two adjacent cell pairs in the same row of the memory array, such as memory array 600. For example, cell pair 501, 502 and cell pair 501', 502' share inter-pair bitline bl 525 that runs between these two cell pairs, as illustrated in FIG. 6. Likewise, cell pair 501, 502 and cell pair 501", 502" share inter-pair bitline bl 565 that runs between these two cell pairs. Memory array 600 replicates the topology of the three cell pairs of row 1 in the remaining square boxes of memory array 600 in rows 2, 3 and 4 below row 1. The read/write heads 700', 700 and 700" cooperate with the intra-pair bitline sharing and inter-pair bitline sharing arrangement above to efficiently write data to, and read data from, the memory cells of memory array 600. Since bitline bl 525' and bitline bl 565" are situated on the peripheral edge or border of the memory array, the memory array does not implement inter-pair bitline sharing for these particular bitlines.

TABLE 3

| | | |
|---|---|---|
| Write Operations | intra-pair bitline sharing | inter-pair bitline sharing |
| Read Operations | intra-pair bitline sharing (singled-ended) | |

Table 3 summarizes the different types of bitline sharing that memory array 600 employs to efficiently write data to, and read data from, the memory array. As seen in Table 3, write operations employ both the disclosed intra-pair bitline sharing and inter-pair bitline sharing, while read operations employ the disclosed single-ended intra-pair bitline sharing.

Figure 8A:
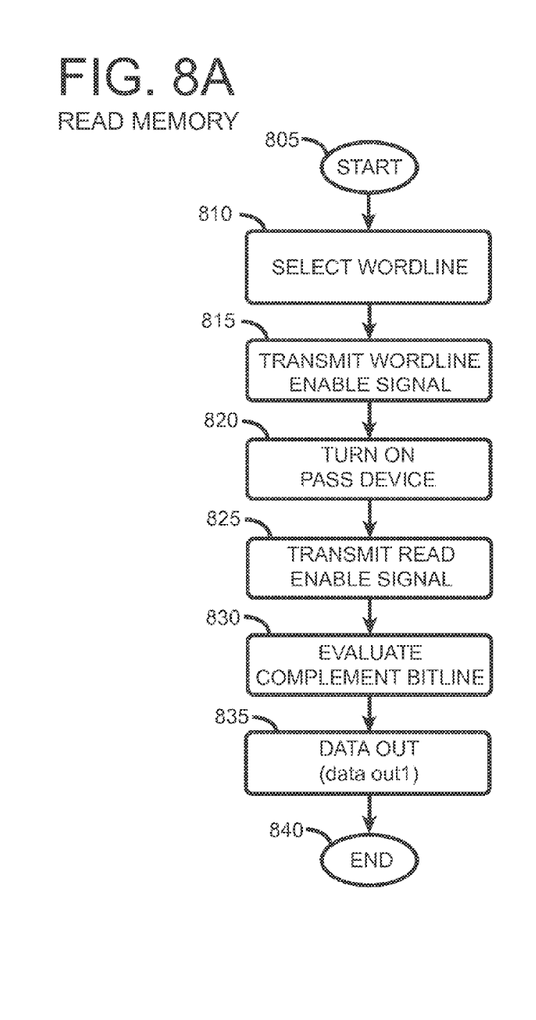
FIG. 8A is a is a flow chart that depicts a method for reading from the contents a memory cell.

FIG. 8A is a flow chart describing a representative read memory operation from a memory cell in the disclosed SRAM array 600. The read memory operation to memory cell 501 or memory cell 502 starts at start block 805. Read/write head 700 transmits a wordline select signal to select wordline wl_a 595 or wordline wl_b 590 of wordline drive circuit 620, as per block 810, corresponding to memory cell 501 or memory cell 502 respectively. The memory read circuit of read/write head 700 transmits a wordline enable signal to the wordline drive circuit 620 driving the selected wordline wl_a 595 or wordline wl_b 590 corresponding to memory cell 501 or 502 respectively, as per block 815. The wordline drive circuit 620 transmits an on signal to pass device 520 in memory cell 501 on wordline wl_a 595, or to pass device 555 on wordline wl_b 590 which turns on the memory cell pass device 520 of memory cell 501 or turns on the memory cell pass device 555 of memory cell 502 respectively, as per block 820. The memory read circuit of read/write head 700 also transmits a read enable signal 706 to gate 715 coupling the shared complement bitline bl' 530 in the read/write head to data out1 704, as per block 825. Gate 715 evaluates the complement bitline bl' 530, as per block 830. Gate 715 outputs the data corresponding to the contents of the selected memory cell 501 or memory cell 502 from complement bitline bl' 530 on the data out1 line at 704, as per block 835. The read memory operation terminates according to block 840. In actual practice, the disclosed memory circuit may commence another memory read or write operation immediately after the read operation discussed above.

Figure 8B:
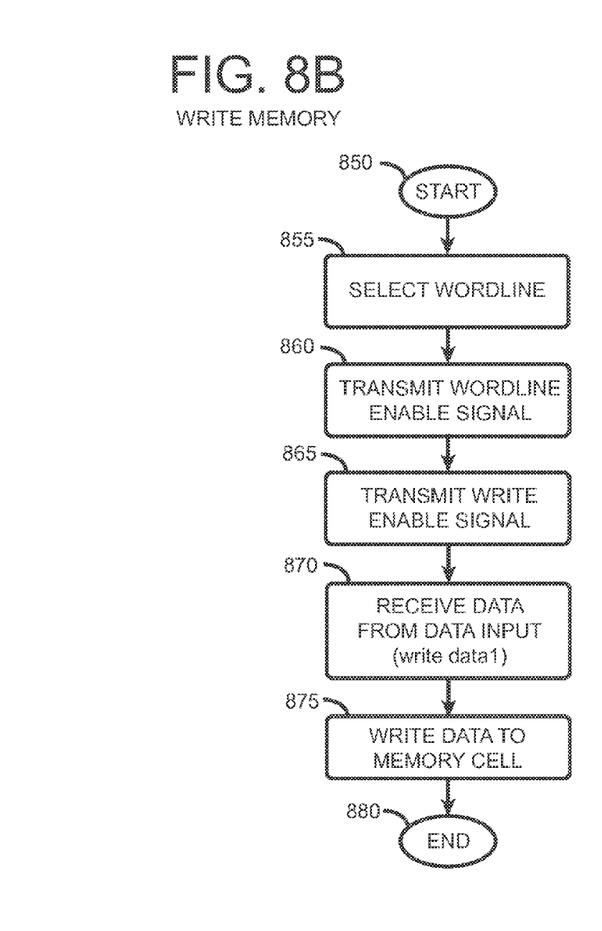
FIG. 8B is a is a flow chart that depicts a method for writing to a memory cell.

FIG. 8B shows a flow chart describing a representative write operation to a memory cell of the disclosed SRAM array. The write memory operation begins at start block 850. The write memory circuit of read/write head 700 selects either wordline wl_a 595 to write data to memory cell 501, or wordline wl_b 590 to write data to memory cell 502, according to block 855. The write memory circuit transmits a wordline enable signal as per block 860 to the wordline drive circuit 620 (which enables both pass devices 515 and 520 or both pass devices 555 and 560 of memory cell 501 or 502 respectively), and to enable either gate 710 or gate 730 in the read/write head controlling driver of the bitline corresponding to a write operation to memory cell 501 or 502 respectively. The write memory circuit transmits a write enable signal 710A or 730A to gate 710 or 730 controlling the driver 705 or 735 of the selected bitline bl 525 or bitline bl 565 respectively, and to driver of the shared complement bitline 530 in the read/write head 700 as per block 865. The read/write head 700 receives data from data input (write data1) 701, as per block 870. The read/write head 700 writes data to the selected memory cell as per block 875 by driving the data through the bitline driver 705 or 735 to bitline 525 or 565, and by driving the data complemented by inverter 725 through driver 720 to the shared complement bitline bl' 530 for a differential write memory operation of the memory cell 501 or 502 respectively. The write memory operation terminates according to block 880. In actual practice, the disclosed memory circuit may commence another memory read or write operation immediately after the write operation discussed above.

Figure 9:
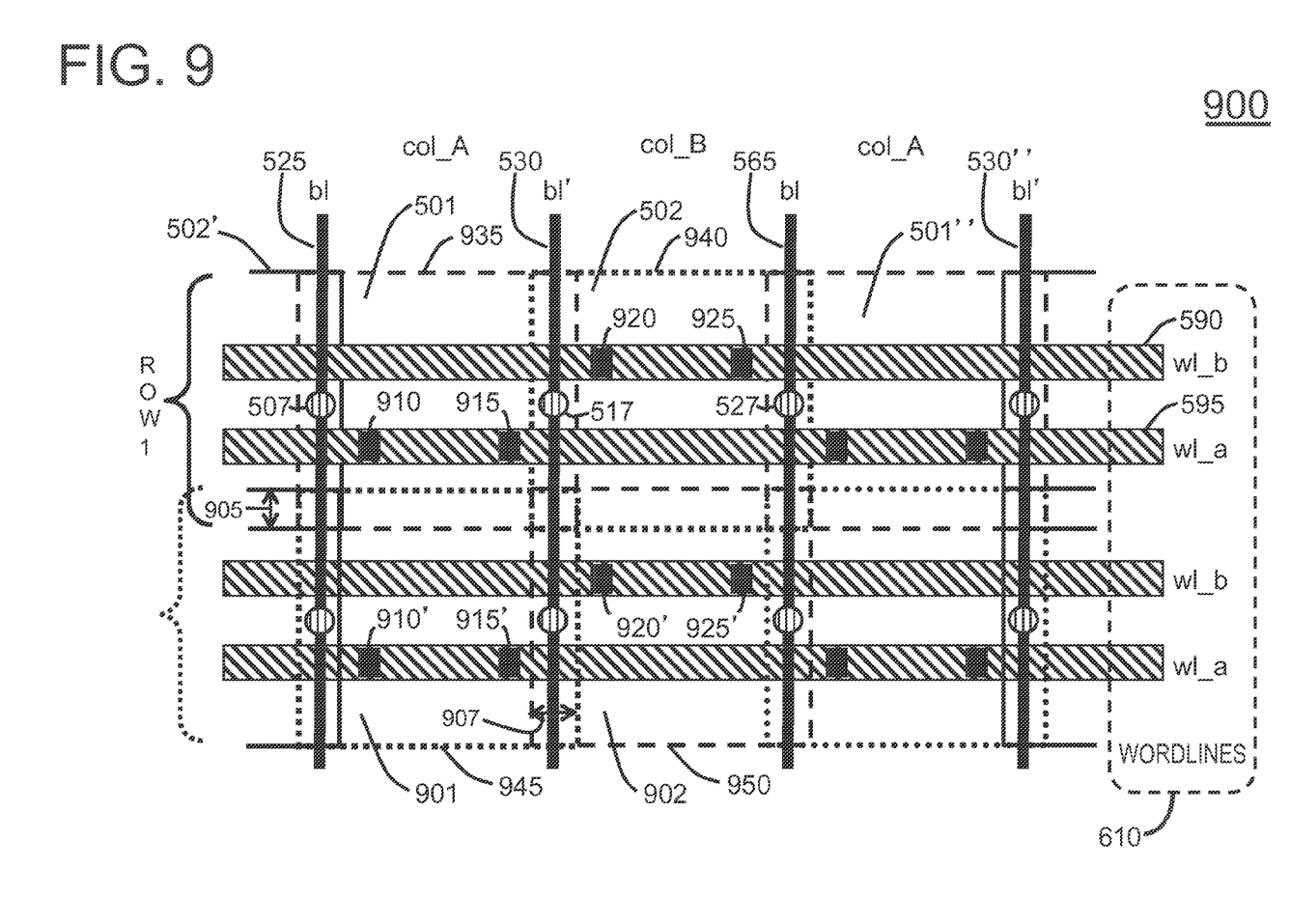
FIG. 9 illustrates a representative portion of a memory cell layout pattern that practices the disclosed methodology.

FIG. 9 shows a representative portion of an integrated circuit layout pattern that practices the disclosed methodology. Memory array 900 includes memory cell pair 501, 502, and memory cell pair 901, 902. Memory cells 501, 502, 901, 902 occupy areas bounded by borders 935, 940, 945 and 950, respectively. Memory cells physically overlap slightly to conserve space in array 900. For example, cell area borders 935 and 945 overlap by a width 905. The entire ROW 1 of memory cells slightly overlaps ROW 2 of memory cells by width 905. Similarly, columns of memory cells overlap slightly to conserve space. By example, memory cell borders 935 and 945 of column A (col_A) overlap memory cell borders 940 and 950 of column B (col_B) respectively overlap by a width 907. More generally, adjacent rows of memory cells overlap by width 905, and adjacent columns of cells overlap by width 907.

Returning to FIG. 5, memory cells 501 and 502 exhibit a particular layout symmetry. Specifically, in this particular embodiment, the orientation of the circuitry of memory cell 502 is "upside down and reversed" with respect to the orientation of the circuitry of memory cell 501, such that memory cells 501 and 502 exhibit quadrilateral symmetry. In other words with such quadrilateral symmetry, memory cell 501 couples to a bl bitline on its left edge, and bl' bitline on its right edge, and a wordline along the lower edge. In contrast, memory cell 502 couples to a bl bitline on its right edge, a bl' bitline on its left edge and a wordline along the upper edge.

Returning to FIG. 9, cells in a column have the same symmetry, while memory cells in a particular row alternate in symmetry. Column B (col_B) memory cells exhibit "upside down and reversed" symmetry (quadrilateral symmetry) with respect to the column A (col_A) memory cells. This arrangement of symmetries facilitates sharing of bitlines between memory cells in adjacent columns. For example, the columns of memory cells adjacent to bitlines bl 525 and 565 as well as bitlines bl' 530 and 530" (also depicted in FIG. 6) share those bitline, respectively. Memory cells 502' and 501 share node 507 of bitline bl 525. Memory cells 501 and 502 share node 517 of bitline bl' 530. Memory cells 502 and 501" share node 527 of bitline bl 565. The "upside down and reversed" (quadrilateral) symmetry in alternating columns of memory cells facilitates pairing of cells, exemplified by memory cells 501 and 502, into column A (col_A) and column B (col_B) memory cells. Wordlines 610 alternate between wordlines that service column A (col_A) exemplified by wordline wl_a 595, and wordlines that service column B (col_B) exemplified by wordline wl_b 590. Specifically, wordline wl_a 595 connects to memory cell 501 at nodes 910 and 915, while wordline wl_b 590 connects to memory cell 502 via nodes 920 and 925. Nodes 910' and 915', and nodes 920' and 925' connect wl_a and wl_b wordlines to memory cells 901 and 902 respectively. More generally, wordlines 610 serve alternate columns of memory cells, with wl_a wordlines coupled to col_A memory cells and wl_b wordlines coupled to col_B memory cells. By pairs of memory cells exhibiting quadrilateral symmetry, it is meant that the topology of the memory cell pairs is such that pairs of memory cells are reflected in both the horizontal and vertical axes, e.g. column B (col_B) memory cells are upside-down and reversed with column A (col_A) memory cells. In summary, the arrangement of symmetries in memory cells facilitates straight paths for wordlines 610 which in turn facilitates compact arrangement of memory cells along columns. Sharing bitlines facilitates compact arrangement of memory cells in the along rows. The symmetries and pairing of memory cells according to the embodiment facilitates a more compact memory array than in other arrangements, and sharing of bitlines results in energy efficiency of reading SRAM.

Sharing of the bitlines as provided by the exemplary embodiments has the benefit that the memory read operation does not needlessly discharge bitlines associated with memory cells for which the data would be discarded. Practicing the disclosed technology may achieve significant energy savings.

Returning now to FIG. 4, information handling system (IHS) 400 employs the disclosed SRAM memory array 200 and/or 600 as SRAM cache 450 and/or SRAM system memory 420. IHS 400 includes a processor 410 that may include multiple cores and SRAM cache 450. IHS 400 processes, transfers, communicates, modifies, stores or otherwise handles information in digital form, analog form or other form. IHS 400 includes a bus 415 that couples processor 410 to system memory 420 via a memory controller 425 and memory bus 430. In one embodiment, system memory 420 is external to processor 410. System memory 420 may be a static random access memory (SRAM) array of FIG. 2 or FIG. 6 and/or a dynamic random access memory (DRAM) array. A video graphics controller 435 couples display 440 to bus 415. Nonvolatile storage 445, such as a hard disk drive, CD drive, DVD drive, or other nonvolatile storage couples to bus 415 to provide IHS 400 with permanent storage of information. I/O devices 490, such as a keyboard and a mouse pointing device, couple to bus 415 via I/O controller 455 and I/O bus 460. One or more expansion busses 465, such as USB, IEEE 1394 bus, ATA, SATA, PCI, PCIE, DVI, HDMI and other busses, couple to bus 415 to facilitate the connection of peripherals and devices to IHS 400. A network interface adapter 405 couples to bus 415 to enable IHS 400 to connect by wires or wirelessly to a network and other information handling systems. IHS 400 may take the form of a desktop, server, portable, laptop, notebook, or other form factor computer or data processing system. IHS 400 may take other form factors such as a gaming device, a personal digital assistant (PDA), a portable telephone device, a communication device or other devices that include a processor and memory. IHS 400 is especially sensitive to energy consumption in the form of a portable, laptop, notebook, gaming device, PDA or any battery-powered device.

IHS 400 may include a computer program product on digital media 475 such as a CD, DVD or other media. In one embodiment, digital media 475 includes an application 482. A user may load application 482 on nonvolatile storage 445 as application 482'. Nonvolatile storage 445 may store an operating system 481. When IHS 400 initializes, the IHS loads operating system 481 and application 485' into system memory 420 for execution as operating system 481' and application 482". Operating system 481' governs the operation of IHS 400.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, blocks, operations, elements, and/or components, but do not preclude the presence or addition of one or more other features, integers, steps, blocks, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. For example, those skilled in the art will appreciate that the logic sense (logic high (1), logic low (0)) of the apparatus and methods described herein may be reversed and still achieve equivalent results. The embodiment was chosen and described in order to best explain the principles of the invention and the practical application, and to enable others of ordinary skill in the art to understand the invention for various embodiments with various modifications as are suited to the particular use contemplated.

We claim:

1. A method, comprising:
configuring a plurality of static random access memory cells in rows and columns, wherein a first pair of memory cells is situated in a first row of the memory array, the first pair of memory cells including first and second memory cells that couple to a first single intra-pair bitline between the first and second cells to share the first single intra-pair bitline, the first and second memory cells also coupling to first and second opposed inter-pair bitlines, respectively;
sharing the first single intra-pair bitline for writing and reading operations of the first pair of memory cells;
sharing the first opposed inter-pair bitline with a second pair of memory cells adjacent the first pair of memory cells in the first row for writing and reading operations of the first pair of memory cells and the second pair of memory cells; and
sharing the second opposed inter-pair bitline with a third pair of memory cells adjacent the first pair of memory cells in the first row for writing and reading operations of the first pair of memory cells and the third pair of memory cells.

2. The method of claim 1, further comprising accessing, by respective first, second and third write heads, the first, second and third pairs of memory cells.

3. A memory array, comprising:
a plurality of memory cells configured in rows and columns;
a first pair of memory cells situated in a first row of the memory array, the first pair of memory cells including first and second memory cells that couple to a first single intra-pair bitline between the first and second cells to share the first single intra-pair bitline, the first and second memory cells also coupling to first and second opposed inter-pair bitlines, respectively;
wherein the first and second memory cells are configured to couple via the first and second opposed inter-pair bitlines to second and third pairs of memory cells, respectively, in the first row of the memory array.

4. The memory array of claim 3, wherein the first and second memory cells share the first single intra-cell bitline for both reading and writing operations.

5. The memory cell of claim 4, wherein the first and second memory cells share the first single intra-cell bitline for single-ended reading operations.

6. The memory cell of claim 3, wherein the first pair of memory cells shares the first opposed inter-pair bitline with the second pair of memory cells.

7. The memory cell of claim 6 wherein the first pair of memory cells shares the second opposed inter-pair bitline with the third pair of memory cells.

8. The memory array of claim 3, wherein each memory cell of the first, second and third memory cell pairs includes a cross-coupled inverter pair and two pass-devices that couple to alternate sides of the cross-coupled inverter pair.

9. The memory array of claim 3, further comprising first, second and third read/write heads coupled to the first, second and third memory cell pairs, respectively.

10. The memory array of claim 3, wherein the rows and columns of the memory cells overlap and cell pairs exhibit quadrilateral symmetry.

11. The memory array of claim 1, wherein the memory cells comprise static random access memory (SRAM).

12. An information handling system (IHS), comprising:
a processor;
a memory, coupled to the processor, the memory including:
a plurality of memory cells configured in a memory array of rows and columns;
a first pair of memory cells situated in a first row of the memory array, the first pair of memory cells including first and second memory cells that couple to a first single intra-pair bitline between the first and second cells to share the first single intra-pair bitline, the first and second memory cells also coupling to first and second opposed inter-pair bitlines, respectively;
wherein the first and second memory cells are configured to couple via the first and second opposed inter-pair bitlines to second and third pairs of memory cells, respectively, in the first row of the memory array.

13. The IHS of claim 12, wherein the first and second memory cells share the first single intra-cell bitline for both reading and writing operations.

14. The IHS of claim 13, wherein the first and second memory cells share the first single intra-cell bitline for single-ended reading operations.

15. The IHS of claim 12, wherein the first pair of memory cells shares the first opposed inter-pair bitline with the second pair of memory cells.

16. The IHS of claim 12, wherein the first pair of memory cells shares the second opposed inter-pair bitline with the third pair of memory cells.

17. The IHS of claim 12, wherein each memory cell of the first, second and third memory cell pairs includes a cross-coupled inverter pair and two pass-devices that couple to alternate sides of the cross-coupled inverter pair.

18. The IHS of claim 12, further comprising first, second and third read/write heads coupled to the first, second and third memory cell pairs, respectively.

19. The IHS of claim 12, wherein the rows and columns of the memory cells overlap and cell pairs exhibit quadrilateral symmetry.

20. The IHS of claim 12, wherein the plurality of memory cells comprise static random access memory (SRAM).

* * * * *